(12) United States Patent
Itaya et al.

(10) Patent No.: US 11,056,262 B2
(45) Date of Patent: Jul. 6, 2021

(54) INDUCTIVE ELEMENT AND LC FILTER

(71) Applicants: KABUSHIKI KAISHA TOYOTA JIDOSHOKKI, Aichi-ken (JP); TOKIN Corporation, Miyagi (JP)

(72) Inventors: Michitaka Itaya, Miyagi (JP); Toshiaki Oka, Miyagi (JP); Koki Harada, Miyagi (JP); Yukiyasu Yamauchi, Miyagi (JP); Takuma Terui, Miyagi (JP); Takeshi Harasawa, Aichi-ken (JP); Atsushi Naito, Aichi-ken (JP); Keiji Yashiro, Aichi-ken (JP); Kazuhiro Shiraishi, Aichi-ken (JP)

(73) Assignees: KABUSHIKI KAISHA TOYOTA JIDOSHOKKI, Aichi-ken (JP); TOKIN Corporation, Miyagi (JP)

( * ) Notice: Subject to any disclaimer, the term of this patent is extended or adjusted under 35 U.S.C. 154(b) by 341 days.

(21) Appl. No.: 16/013,207

(22) Filed: Jun. 20, 2018

(65) Prior Publication Data
US 2019/0006079 A1 Jan. 3, 2019

(30) Foreign Application Priority Data

Jun. 30, 2017 (JP) .............................. JP2017-128372

(51) Int. Cl.
*H01F 17/06* (2006.01)
*H05K 1/02* (2006.01)
(Continued)

(52) U.S. Cl.
CPC ............... *H01F 17/06* (2013.01); *H01F 5/04* (2013.01); *H01F 17/062* (2013.01); *H01F 27/02* (2013.01);
(Continued)

(58) Field of Classification Search
CPC .............................. H01F 17/06; H01F 17/062
See application file for complete search history.

(56) References Cited

U.S. PATENT DOCUMENTS 3,680,018 A * 7/1972 Elberger ................. H01F 17/04
336/221
4,646,803 A * 3/1987 Hanaoka ............... H01F 27/306
206/303
(Continued)

FOREIGN PATENT DOCUMENTS

| JP | 2000-068134 A | 3/2000 |
| JP | 2008098307 | 4/2008 |

(Continued)

OTHER PUBLICATIONS

Office Action dated Jul. 22, 2019 in the corresponding KR Patent Application No. 2018-0075730.

*Primary Examiner* — Elvin G Enad
*Assistant Examiner* — Malcolm Barnes
(74) *Attorney, Agent, or Firm* — Renner, Otto, Boisselle & Sklar LLP

(57) ABSTRACT

The present disclosure provides an inductive element capable of lowering a Q-value. An inductive element includes a first cover and a second cover covering an annular core, and a first winding and a second winding wound around a region of the core, the first cover and the second cover. The first cover covers a part of an inner circumferential surface of the core, a part of an outer circumferential surface and an end surface on one end side in an axial direction. The second cover covers a part of the inner circumferential surface of the core, a part of the outer circumferential surface an end surface on the other end side in the axial direction.

2 Claims, 13 Drawing Sheets

(51) Int. Cl.
*H03H 7/01* (2006.01)
*H01F 5/04* (2006.01)
*H03H 7/09* (2006.01)
*H01F 27/32* (2006.01)
*H01F 27/02* (2006.01)
*H01F 27/28* (2006.01)
*H03H 1/00* (2006.01)
*H03H 7/42* (2006.01)

(52) U.S. Cl.
CPC ....... H01F 27/2823 (2013.01); H01F 27/324 (2013.01); H01F 27/325 (2013.01); H03H 7/0115 (2013.01); H03H 7/09 (2013.01); H03H 7/1741 (2013.01); H05K 1/0203 (2013.01); *H03H 7/427* (2013.01); *H03H 2001/0021* (2013.01)

(56) References Cited

U.S. PATENT DOCUMENTS

| | | | |
|---|---|---|---|
| 5,717,373 A * | 2/1998 | Vachris | H01F 27/2895 336/206 |
| 6,081,180 A * | 6/2000 | Fernandez | H01F 17/062 336/229 |
| 6,246,311 B1 * | 6/2001 | Finnemore | H01F 17/062 336/192 |
| 10,780,764 B2 * | 9/2020 | Ambo | F04B 39/121 |
| 2004/0022294 A1 * | 2/2004 | Yamamori | H01F 27/324 372/61 |
| 2004/0233015 A1 * | 11/2004 | Tsai | H03H 7/427 333/181 |
| 2006/0192649 A1 * | 8/2006 | Feth | H01F 17/062 336/229 |
| 2009/0289754 A1 * | 11/2009 | Shpiro | H01F 17/062 336/84 C |
| 2012/0319810 A1 * | 12/2012 | Tseng | H01F 27/027 336/65 |
| 2018/0374633 A1 * | 12/2018 | Komiyama | H01F 27/2895 |
| 2019/0272948 A1 * | 9/2019 | Hwang | C08K 3/40 |
| 2019/0311845 A1 * | 10/2019 | Imanishi | H01F 37/00 |
| 2020/0234866 A1 * | 7/2020 | Lee | H01F 17/062 |

FOREIGN PATENT DOCUMENTS

| | | |
|---|---|---|
| JP | 2011-192825 A | 9/2011 |
| KR | 2007-0086217 A | 8/2007 |
| WO | 2006/064499 A2 | 6/2002 |

* cited by examiner

INDUCTIVE ELEMENT AND LC FILTER

INCORPORATION BY REFERENCE

This application is based upon and claims the benefit of priority from Japanese patent application No. 2017-128372, filed on Jun. 30, 2017, the disclosure of which is incorporated herein in its entirety by reference.

BACKGROUND

The present disclosure relates to an inductive element and an LC filter.

There has been known an inductive element which includes a core, a conductor covering a surface of the core, a dielectric covering the conductor, and a coil formed by directly winding a coated conductive wire around the dielectric. Japanese Unexamined Patent Application Publication No. 2008-098307 discloses an example of such an inductive element.

SUMMARY

The present inventors have found the following problem. It has been required to deliberately adjust a Q-value to a low value. It is desirable that the Q-value be low because when the Q-value is low, normal mode noises at frequencies near the resonance point, for example, tend to be easily lowered.

An inductive element according to the present disclosure lowers the Q-value.

A first exemplary aspect is an inductive element including:

an annular core;

a first cover and a second cover (e.g., covers 2 and 3) covering the core; and a first winding and a second winding (e.g., windings 4 and 5) wound around a region of the core and the first and second covers, in which when a direction in which an axis which is surrounded by the annular core extends is defined as an axial direction, the core includes an inner circumferential surface, an outer circumferential surface, an end surface on one end side in the axial direction (e.g., one of end surfaces 1c and 1d), and an end surface on the other end side (e.g., the other of end surfaces 1c and 1d), the first cover covers a part of the inner circumferential surface of the core, a part of the outer circumferential surface thereof, and the end surface on the one end side thereof, and includes an inner end surface extending over the inner circumferential surface of the core and an outer end surface extending over the outer circumferential surface thereof, the second cover covers a part of the inner circumferential surface of the core, a part of the outer circumferential surface thereof, and the end surface on the other end side thereof, and includes an inner end surface extending over the inner circumferential surface of the core and an outer end surface extending over the outer circumferential surface thereof, the inner end surfaces of the first and second covers are spaced apart from each other, and the outer end surfaces of the first and second covers are spaced apart from each other.

By the above-described configuration, an LC filter including the above-described inductive element has an increased resistance component Rs for the normal mode. Therefore, the Q-value can be lowered.

Further, the inner end surfaces of the first and second covers may be spaced apart from each other by a predetermined interval (e.g., an interval S1) over their entire areas, and the outer end surfaces of the first and second covers may be spaced apart from each other by a predetermined interval (e.g., an interval S2) over their entire areas. Further, the interval between the inner end surfaces of the first and second covers may be larger than the interval between the outer end surfaces of the first and second covers. Further, the first and second windings may be spaced apart from each other by a predetermined interval. The inductive element may further include a case, and the case may include an opening from which a part of the first and second covers may be exposed.

Further, the inductive element may further include a heat sink, and the heat sink may be disposed between the first and second windings. Since a part located between the windings generates a larger amount of heat than the other part does, the heat sink can quickly radiate (i.e., dissipate) the generated heat.

Further, another exemplary aspect is an LC filter including an inductive element, the inductive element including:

an annular core;

a first cover and a second cover covering the core; and a first winding and a second winding wound around a region of the core and the first and second covers, in which when a direction in which an axis which is surrounded by the annular core extends is defined as an axial direction, the core includes an inner circumferential surface, an outer circumferential surface, an end surface on one end side in the axial direction, and an end surface on the other end side, the first cover covers a part of the inner circumferential surface of the core, a part of the outer circumferential surface thereof, and the end surface on the one end side of the core, and includes an inner end surface extending over the inner circumferential surface of the core and an outer end surface extending over the outer circumferential surface thereof, the second cover covers a part of the inner circumferential surface of the core, a part of the outer circumferential surface thereof, and the end surface on the other end side thereof, and includes an inner end surface extending over the inner circumferential surface of the core and an outer end surface extending over the outer circumferential surface thereof, the inner end surfaces of the first and second covers are spaced apart from each other, and the outer end surfaces of the first and second covers are spaced apart from each other.

By the above-described configuration, a resistance component Rs for the normal mode increases. Therefore, the Q-value can be lowered.

An inductive element according to the present disclosure can lower the Q-value.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
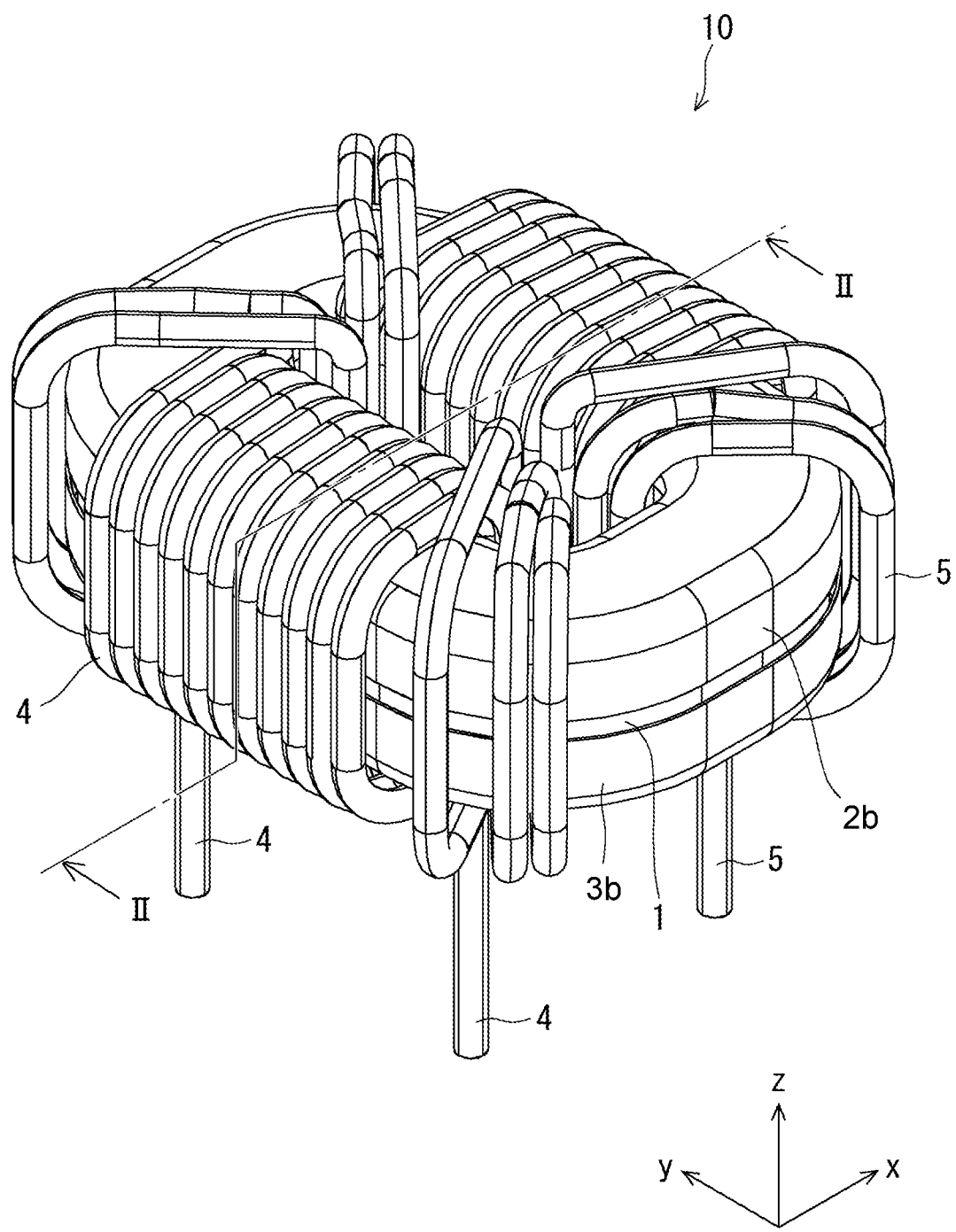
FIG. 1 is a perspective view of an inductive element according to a first embodiment.
Figure 2:
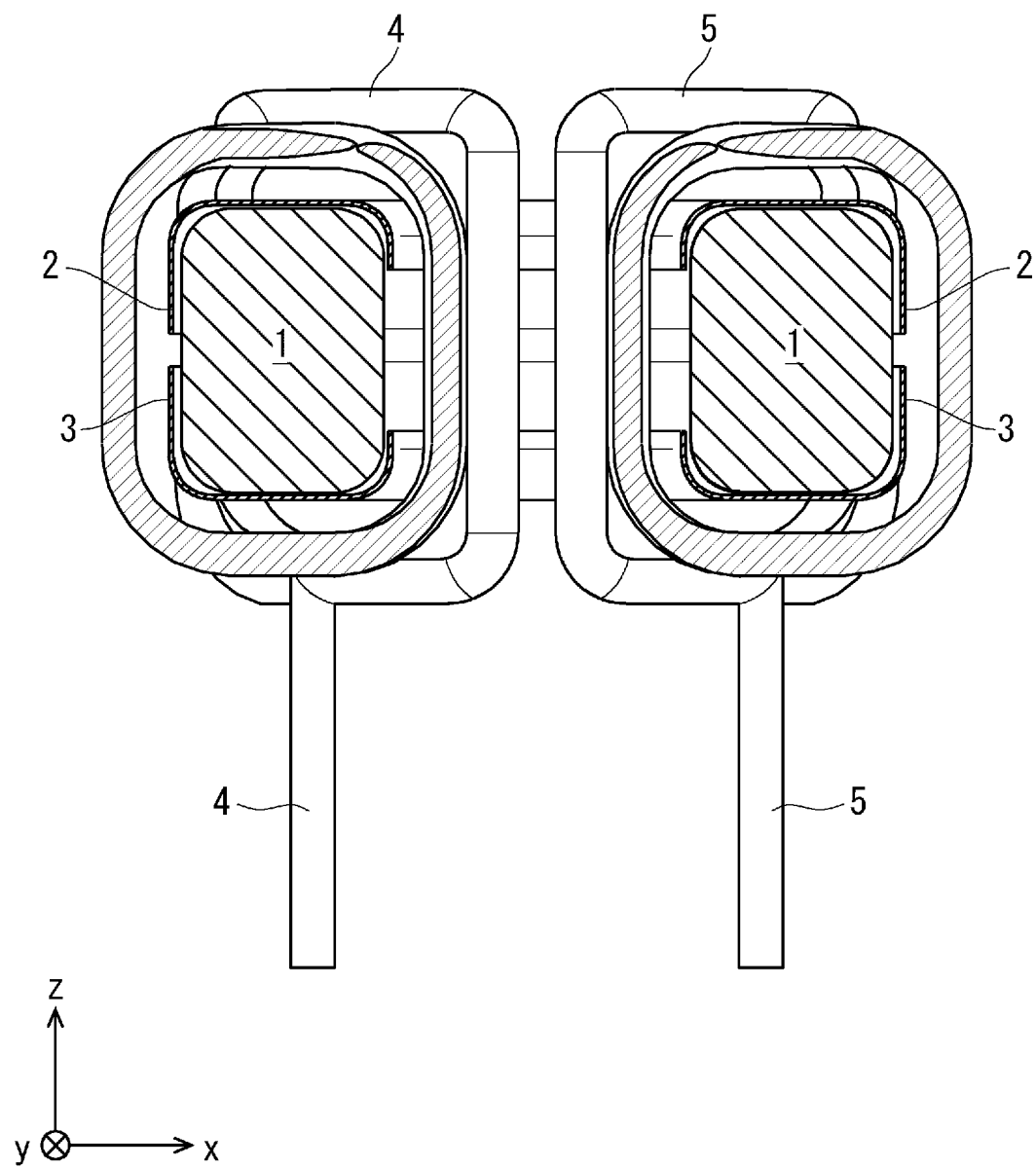
FIG. 2 is a cross section of the inductive element according to the first embodiment.

An inductive element according to a first embodiment is described hereinafter with reference to FIGS. 1 to 2. FIG. 1 is a perspective view of an inductive element according to the first embodiment. FIG. 2 is a cross section of the inductive element according to the first embodiment.

As shown in FIGS. 1 and 2, the inductive element 10 includes a core 1, covers 2 and 3, and windings 4 and 5.

Figure 3:
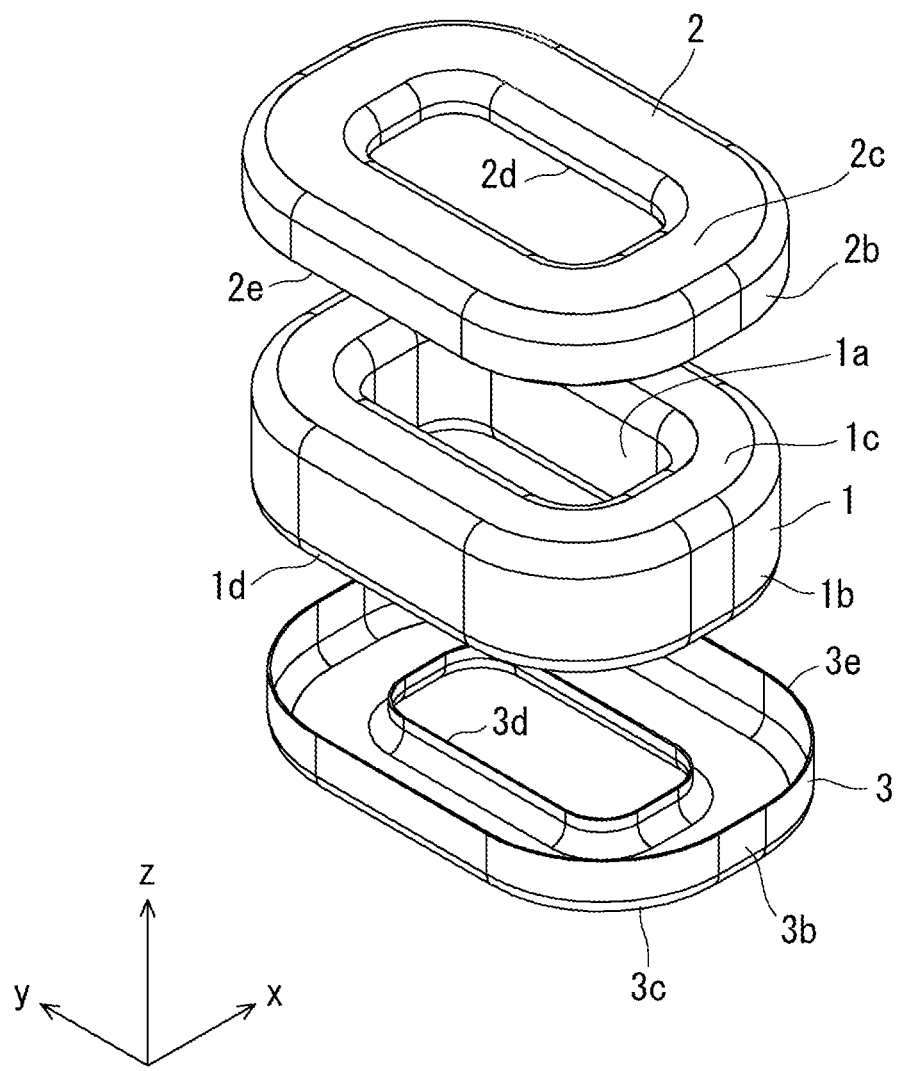
FIG. 3 is an exploded perspective view of a main part of the inductive element according to the first embodiment.

As shown in FIG. 3, the core 1 may be any kind of an annular body. Specifically, the core 1 may have a roughly circular shape, a roughly elliptical shape, or a rectangular shape having rounded corners. Alternatively, the core 1 may be an annular body having a shape similar to a running track. The shape similar to a running track has two long-side parts which extend roughly in a straight line in parallel to each other and two short-side parts each of which extends in a curved manner in a semi-circular shape and connects the long-side parts to each other. The core 1 has an inner circumferential surface 1a, an outer circumferential surface 1b, and end surfaces 1c and 1d in an axial direction (a Z-axis direction in this example). The axial direction is a direction in which an axis (a Z-axis in this example) extends and this axis is surrounded by the core 1. The core 1 can be formed by using a wide variety of well-known core materials. For example, the core 1 can be formed by using a ferrite material.

Figure 4:
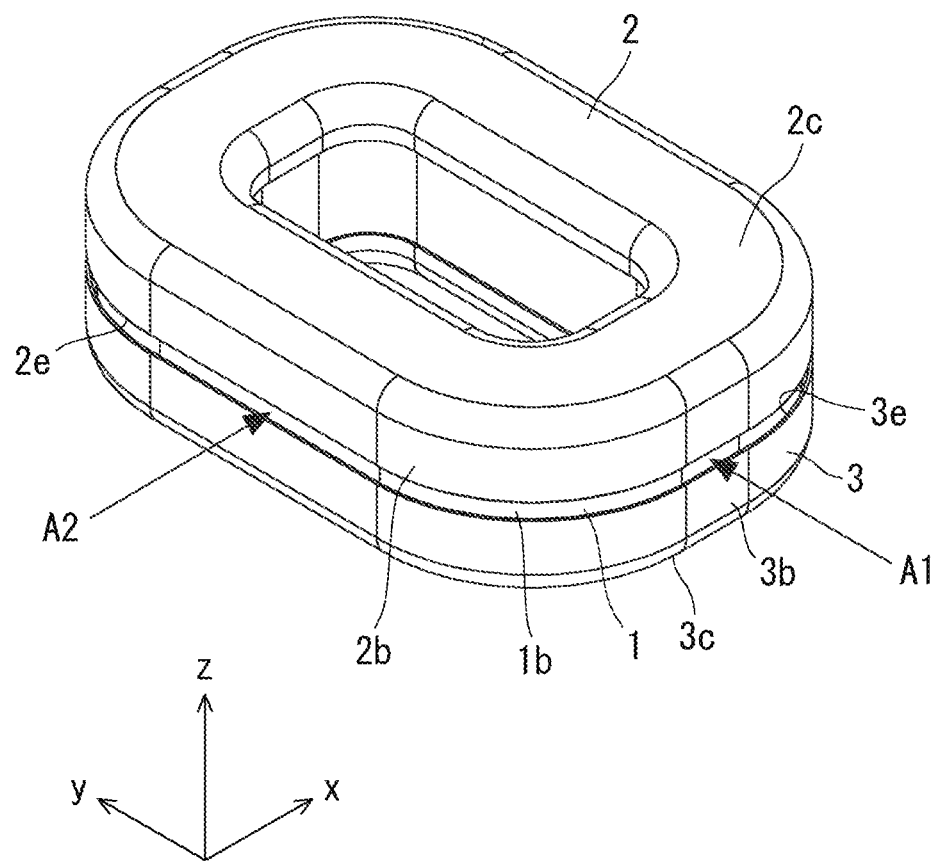
FIG. 4 is a perspective view of the main part of the inductive element according to the first embodiment.

As shown in FIGS. 3 and 4, the covers 2 and 3 are made of, for example, a metal material or a metal-resin composite material synthesized from a metal material and a resin. These metal materials are preferably nonmagnetic. Further, examples of these metal materials include pure Al, pure Cu, pure Ag, pure Au, and alloys thereof.

Figure 5:
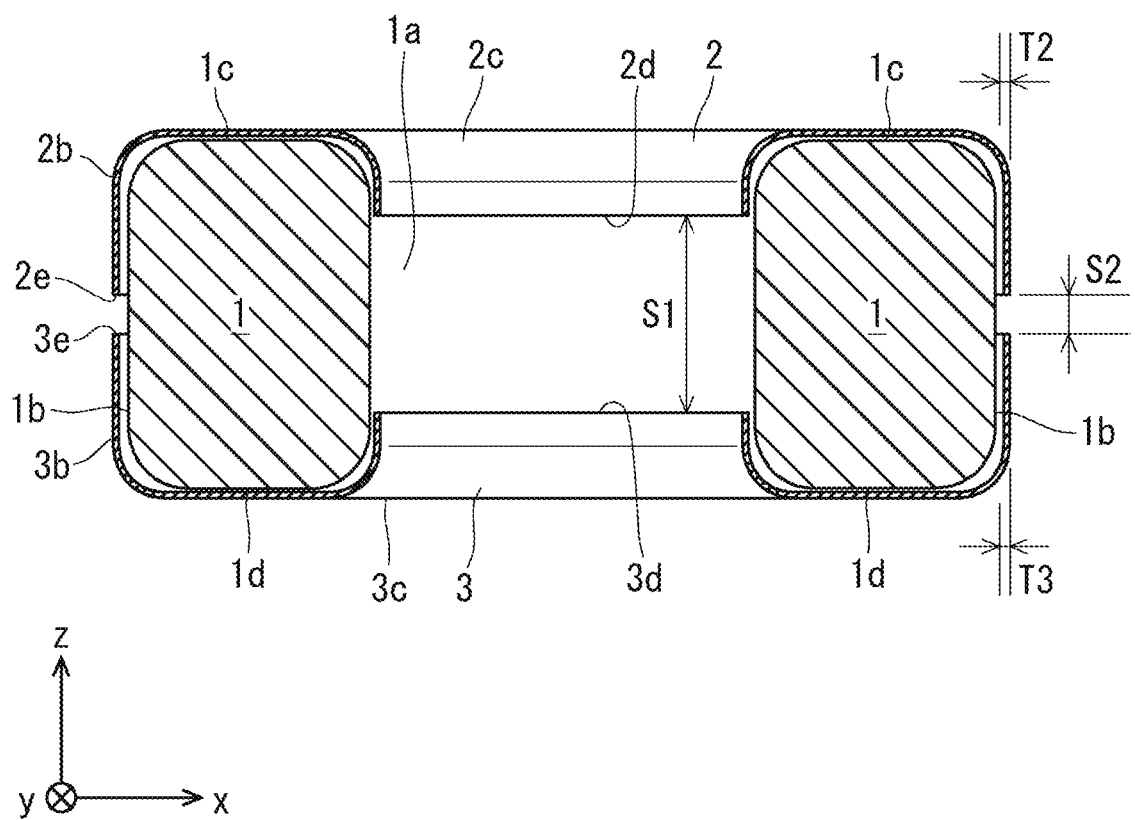
FIG. 5 is a cross section of the main part of the inductive element according to the first embodiment.

The cover 2 covers a part of the inner circumferential surface 1a of the core 1, and a part of the outer circumferential surface 1b thereof, and the entire end surface 1c thereof. The cover 3 covers a part of the inner circumferential surface 1a of the core 1, a part of the outer circumferential surface 1b thereof, and the entire end surface 1d thereof. An inner end surface 2d of the cover 2 extends over the inner circumferential surface 1a of the core 1 and an outer end surface 2e of the cover 2 extends over the outer circumferential surface 1b of the core 1. An inner end surface 3d of the cover 3 extends over the inner circumferential surface 1a of the core 1 and an outer end surface 3e of the cover 3 extends over the outer circumferential surface 1b of the core 1. The inner end surface 2d of the cover 2 and the inner end surface 3d of the cover 3 need to be spaced apart from each other. For example, as shown in FIG. 5, the inner end surfaces 2d and 3d are preferably spaced apart from each other by a predetermined interval S1 over their entire respective areas. The outer end surface 2e of the cover 2 and the outer end surface 3e of the cover 3 need to be spaced apart from each other. For example, the outer end surfaces 2e and 3e are preferably spaced apart from each other by a predetermined interval S2 over their entire respective areas. The intervals S1 and S2 do not necessarily have to be located at the centers of the inner circumferential surface 1a and the outer circumferential surface 1b, respectively, of the core 1. That is, they may be displaced from the centers of the inner and outer circumferential surfaces. The covers 2 and 3 preferably have predetermined thicknesses T2 and T3, respectively. The thicknesses T2 and T3 are preferably smaller than a diameter of the core 1, and are preferably such thicknesses that the inductive element 10 does not lose its properties necessary as an inductive element. Each of the thicknesses T2 and T3 is, for example, a thickness in a range no smaller than 0.2% of the diameter of the core 1 and no larger than 4% of the diameter of the core 1.

Each of the windings 4 and 5 may be any type of a conductive wire that can conduct electricity. For example, it may be a copper wire or an enamel-coated wire. The winding 4 is wound around a region (i.e., a part) of the core 1 and the covers 2 and 3. The winding 5 is wound around another region (i.e., another part) of the core 1 and the covers 2 and 3, and is spaced apart from the winding 4 by a predetermined interval. In other words, there is a predetermined interval between the windings 4 and 5.

Modified Example 1

Next, a modified example of the inductive element 10 is described with reference to FIG. 6. This modified example has the same configuration as that of the inductive element 10, except that the modified example includes a case.

Figure 6:
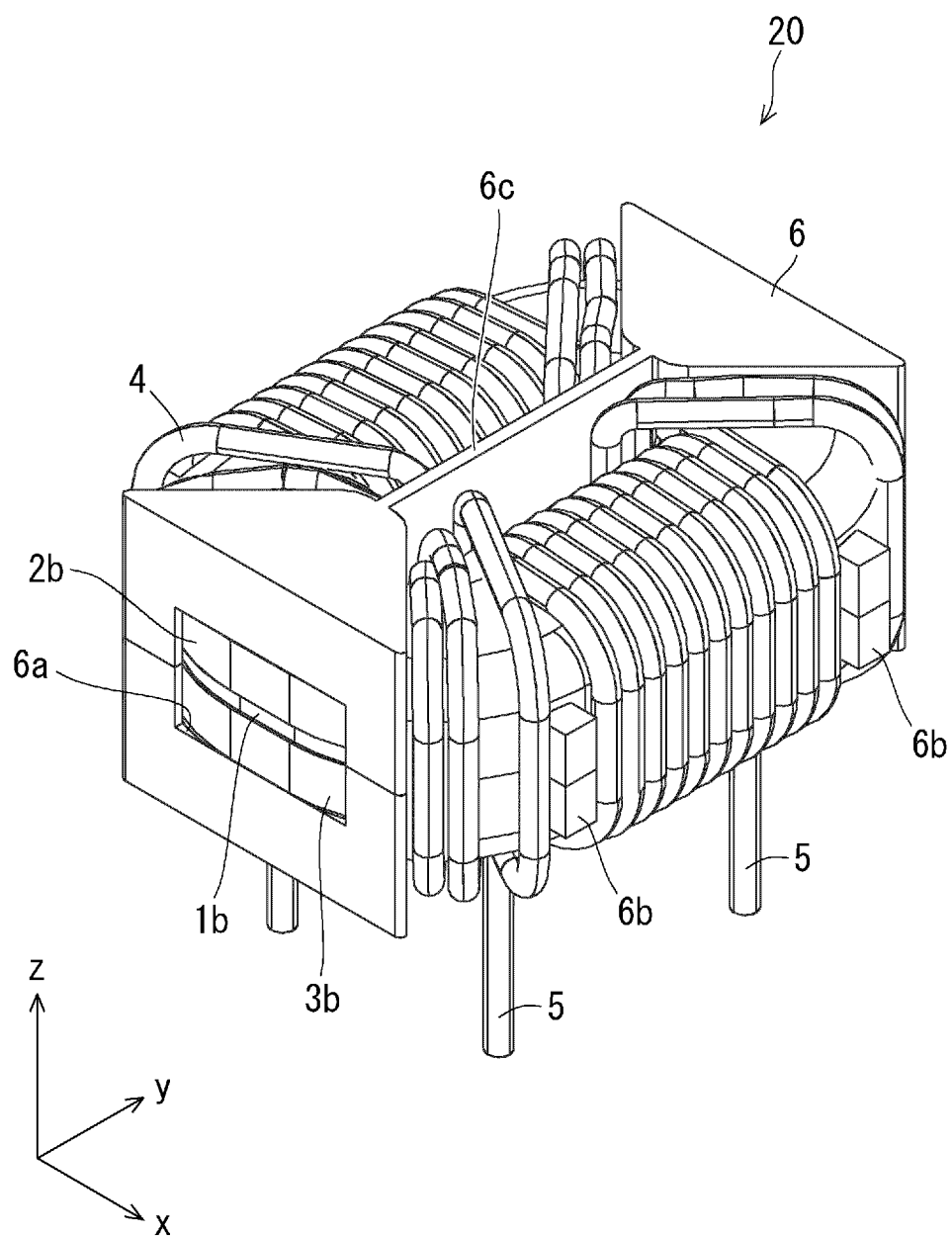
FIG. 6 is a perspective view of a modified example of the inductive element according to the first embodiment.

As shown in FIG. 6, an inductive element 20 includes a case 6. The case 6 is made of an electrically-insulating material. Examples of such a material include resins. The case 6 includes an opening(s) 6a, protrusions 6b, and a wall 6c. The case 6 covers the entire areas of the core 1 and the covers 2 and 3 except for a part corresponding to the opening 6a. Further, the windings 4 and 5 are wound around the case 6. The opening 6a is disposed between the windings 4 and 5. Therefore, a part of each of the core 1 and the covers 2 and 3 located between the windings 4 and 5 is exposed to the outside of the inductive element 20. Specifically, the opening 6a is formed so that a part of the outer circumferential surface 1b of the core 1, a part of the outer circumferential surface 2b of the cover 2, and a part of the outer circumferential surface 3b of the cover 3 are exposed to the outside of the inductive element 20. A plurality of protrusions 6b protrude from the outer circumferential surface 2b of the cover 2 and the outer circumferential surface 3b of the cover 3 in the radial direction of the core 1 and separate a part(s) of the winding 4 from the other part of the winding 4. The protrusions 6b may separate a part(s) of the winding 5 from the other part of the winding 5. The wall 6c is disposed between the windings 4 and 5 on the inner circumferential surface 1a side of the core 1 and separates the winding 4 from the winding 5.

In the inductive element 20, the opening part 6a exposes a part of the outer circumferential surface 1b of the core 1, a part of the outer circumferential surface 2b of the cover 2, and a part of the outer circumferential surface 3b of the cover 3 to the outside of the inductive element 20 between the windings 4 and 5. Therefore, these parts can radiate heat more quickly than the other part of the inductive element 20 does.

It should be noted that there has been known an inductive element (not shown) which has the same configuration as that of the inductive element 20, expect that it includes a case that, unlike the case 6, covers the entire areas of the core 1 and the covers 2 and 3. In such an inductive element, a part of the outer circumferential surface 1b of the core 1, a part of the outer circumferential surface 2b of the cover 2, and a part of the outer circumferential surface 3b of the cover 3 located between the windings 4 and 5 tend to generate a larger amount of heat than the other part of the inductive element 20 does. Therefore, compared to such a related-art inductive element, the inductive element 20 according to this embodiment can radiate (i.e., dissipate) heat more quickly from the part of the outer circumferential surface 1b of the core 1, the part of the outer circumferential surface 2b of the cover 2, and the part of the outer circumferential surface 3b of the cover 3 located between the windings 4 and 5.

Modified Example 2

Next, another modified example is described with reference to FIG. 7. This modified example has the same configuration as that of the inductive element 10 except that it includes a case.

Figure 7:
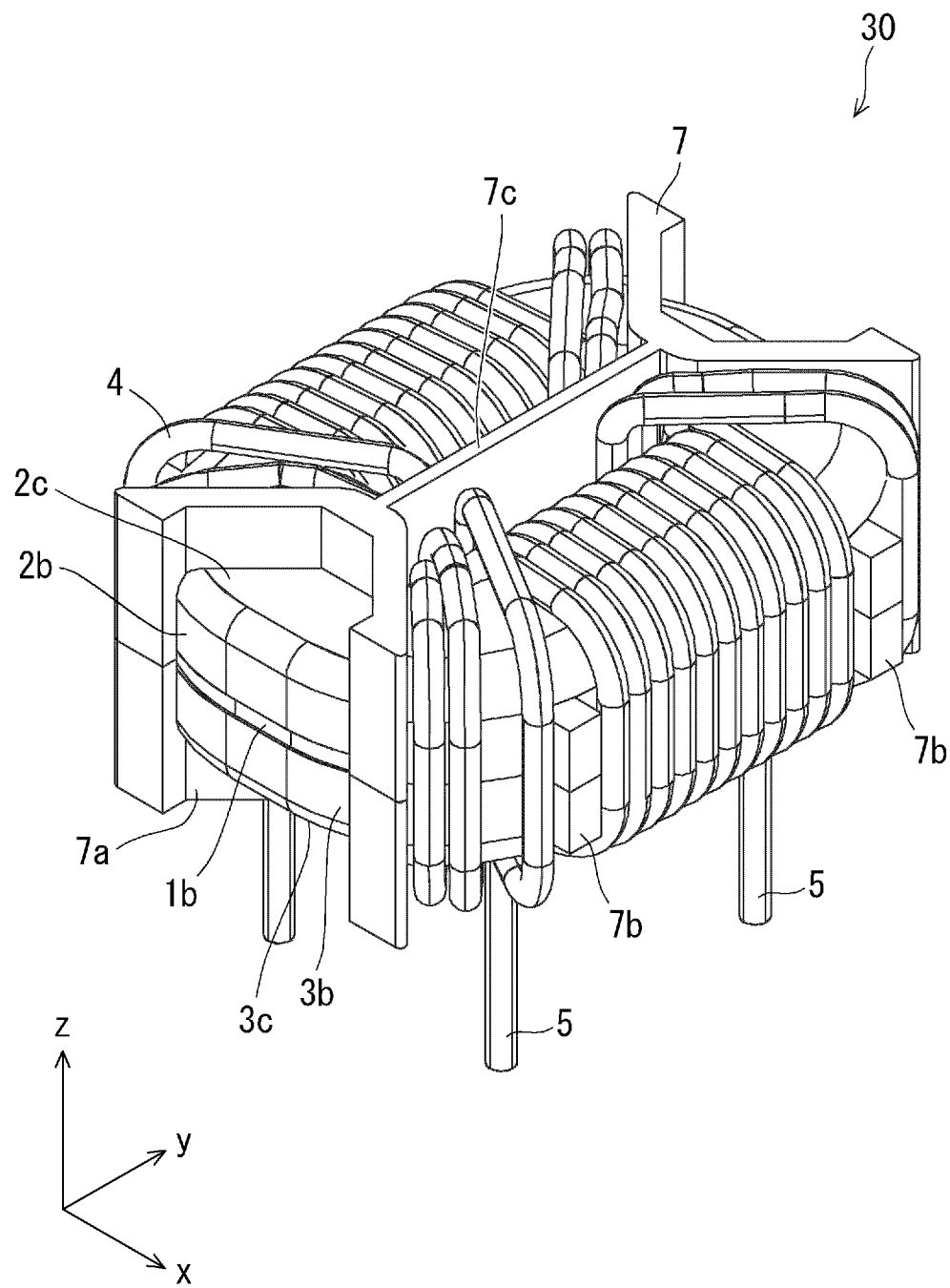
FIG. 7 is a perspective view of another modified example of the inductive element according to the first embodiment.

As shown in FIG. 7, an inductive element 30 includes a case 7. The case 7 has the same configuration as that of the case 6 (see FIG. 6) except for an opening 7a. The case 7 includes an opening(s) 7a, protrusions 7b, and a wall 7c. The opening 7a is disposed between the windings 4 and 5. Therefore, a part of each of the core 1 and the covers 2 and 3 located between the windings 4 and 5 is exposed to the outside of the inductive element 30. Specifically, the opening 7a is formed so that a part of each of the outer circumferential surface 1b of the core 1, the outer circumferential surface 2b of the cover 2, an end surface 2c thereof, the outer circumferential surface 3b of the cover 3, and an end surface 3c thereof is exposed to the outside of the inductive element 30. The protrusions 7b and the wall 7c have the same configuration as that of the protrusions 6b and the wall 6c.

Note that in the inductive element 20 (see FIG. 6), the part of the outer circumferential surface 1b of the core 1, the part of the outer circumferential surface 2b of the cover 2, and the part of the outer circumferential surface 3b of the cover 3 are exposed to the outside of the inductive element 20. In contrast to this, in the inductive element 30, in addition to the parts exposed in the inductive element 20, a part of each of the end surface 2c of the cover 2 and the end surface 3c of the cover 3 is also exposed to the outside of the inductive element 30. In other words, the area exposed to the outside in the inductive element 30 is larger than the area exposed to the outside in the inductive element 20. Therefore, the inductive element 30 has a better heat radiating property than that of the inductive element 20.

Further, an LC filter may be formed by using at least one of the inductive elements 10, 20 and 30. An LC filter 100 (not shown), which is an example of such an LC filter, can be formed by connecting at least one of the inductive elements 10, 20, and 30 with X capacitors.

It should be noted that there has been known a related-art LC filter which has the same configuration as that of the LC filter 100, expect that it does not include the covers 2 and 3. It is considered that the LC filter 100 does not significantly differ from the related-art LC filter and the presence/absence of the covers 2 and 3 does not significantly affect the common mode characteristic.

Since the LC filter 100 has the configuration in which the core 1 is covered by at least one of the covers 2 and 3 containing metal, a leakage flux is generated in at least one of the inductive elements 10, 20 and 30 in the normal mode. This leakage flux interacts with the covers 2 and 3 and thereby generates eddy currents. Since the inner end surface 2d of the cover 2 and the inner end surface 3d of the cover 3 are spaced apart from each other, the eddy currents do not cancel out each other inside the covers 2 and 3. Therefore, they have excellent values. As the eddy currents increase the magnetic resistance, the resistance component Rs for the normal mode increases. Therefore, the LC filter 100 has an excellent resistance component Rs and can lower the Q-value. That is, in the LC filter 100, the Q-value can be lowered without requiring a resistor or the like to be connected in series with the inductive element 10, 20 or 30 included in the LC filter 100. Therefore, the LC filter 100 can prevent the inductive element 10, 20 or 30 from being increased in size and maintain the size/shape of the inductive element 10, 20 or 30.

Note that the inductive element 20 or 30 may include a heat sink (not shown) that is in contact with the cover 2 near the opening 6a or the cover 3 near the opening 7a. In the case where the inductive element 20 or 30 includes such a heat sink, the inductive element 20 or 30 quickly transfers heat from the cover 2 or 3 to the heat sink. Therefore, the inductive element 20 or 30 can have a higher heat radiating property.

Further, various devices such as an inverter device mounted on a vehicle may be formed by using the above-described inductive element and the LC filter. Further, an in-vehicle air conditioner may be formed by using the aforementioned various devices such as an inverter device.

EXAMPLES

Next, results that were obtained by measuring various characteristics for examples of the inductive element 20 (see FIG. 6) and their calculation results are explained with reference to FIGS. 8 to 13.

(Manufacturing Condition)

For the examples of the inductive element 20, cores were manufactured using a ferrite material having a magnetic permeability of 4,500 H/m. The core was an annular body having a shape similar to a running track. An outer size of the core was 30 mm×20 mm×10 mm and a cross-sectional shape of the core was 5 mm×10 mm. A copper wire having a diameter of 1.3 mm was used for windings. The windings were wound 16 turns on both of the long-side parts of the core so that the example of the inductive element 20 constitutes a common-mode inductive element. A material for forming the covers was, in principle, an aluminum alloy and a copper alloy was also used as appropriate. The thicknesses T1 and T2 of the covers were, in principle, 0.15 mm and standard levels were defined as required. The interval S1 between the inner end surfaces of the covers was 5 mm. The interval S2 between the outer end surfaces of the covers was, in principle, 1 mm and standard levels were defined as required. These defined standard levels will be described later.

Note that a comparative example has the same configuration as that of the example of the inductive element 10, except that the comparative example includes no cover corresponding to the covers 2 and 3.

(Measuring Method)

Figure 8:
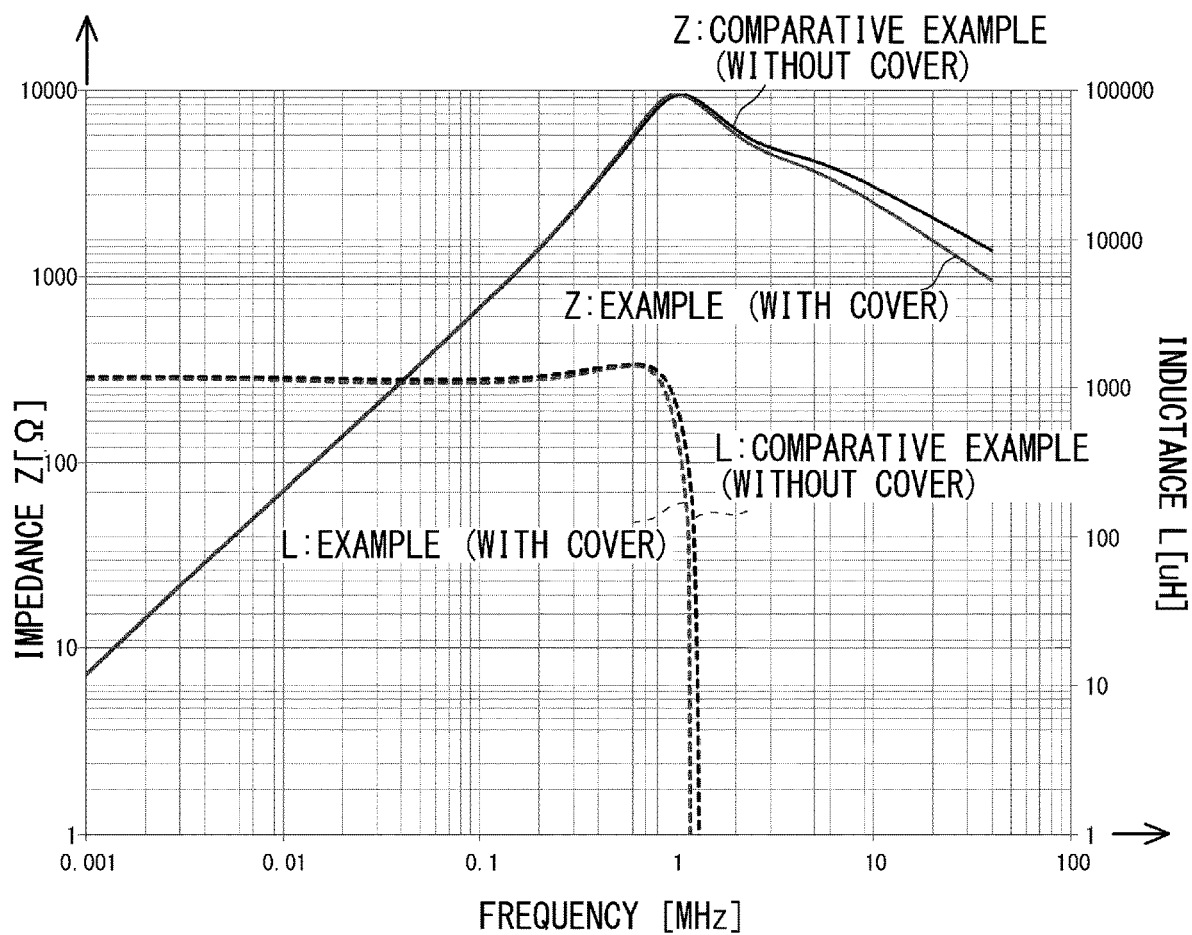
FIG. 8 is a graph showing impedances and inductances versus frequencies.

Firstly, common mode characteristics of the example of the inductive element 10 and its comparative example were measured. FIG. 8 shows the measurement results. Note that the measured common mode characteristics were impedances Z and inductances L versus frequencies in a predetermined range.

Figure 9:
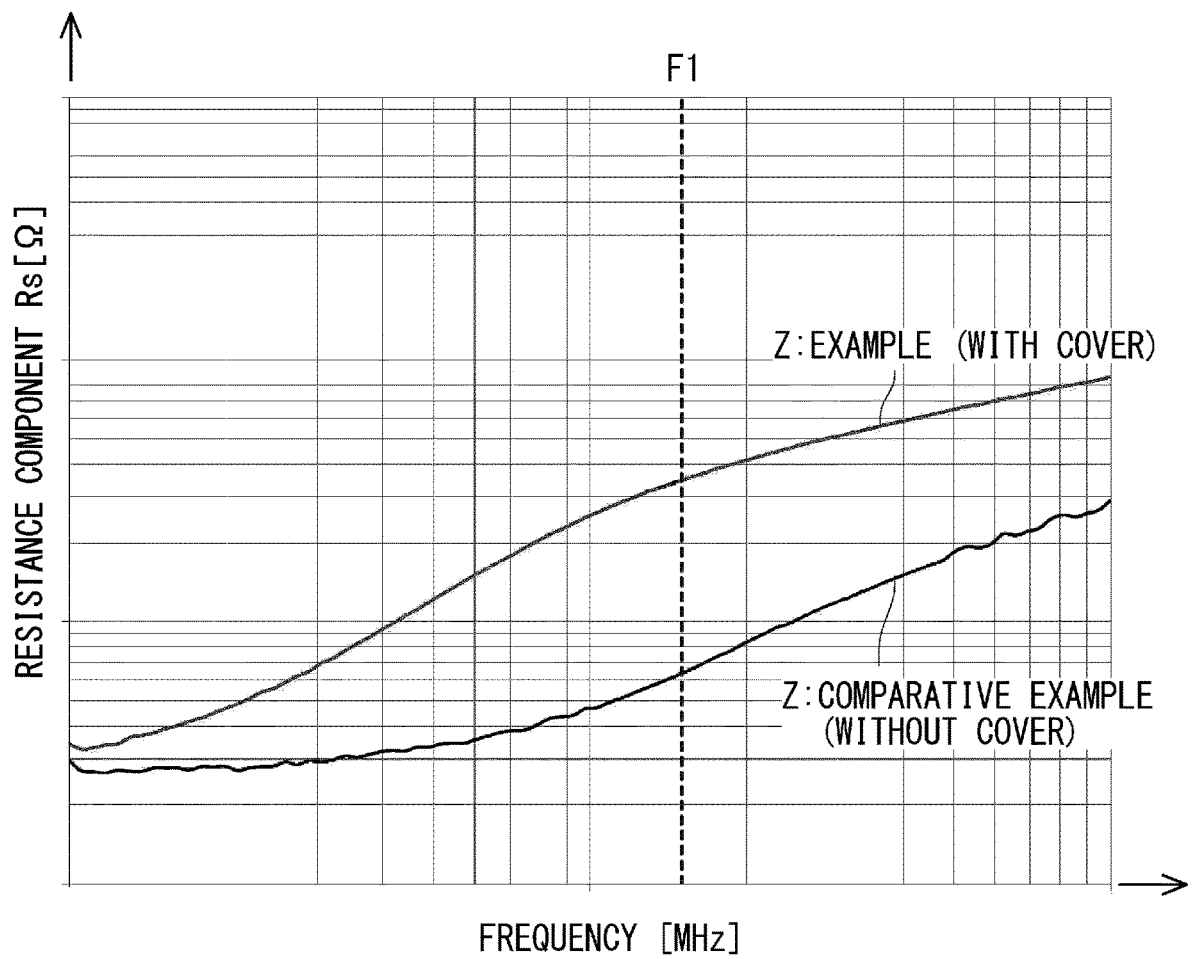
FIG. 9 is a graph showing impedances versus frequencies.

Next, resistance component characteristics in the normal mode were measured. FIG. 9 shows the measurement results. Note that the measured resistance components Rs in the normal mode were obtained by measuring impedances Z versus frequencies in a predetermined range.

Figure 10:
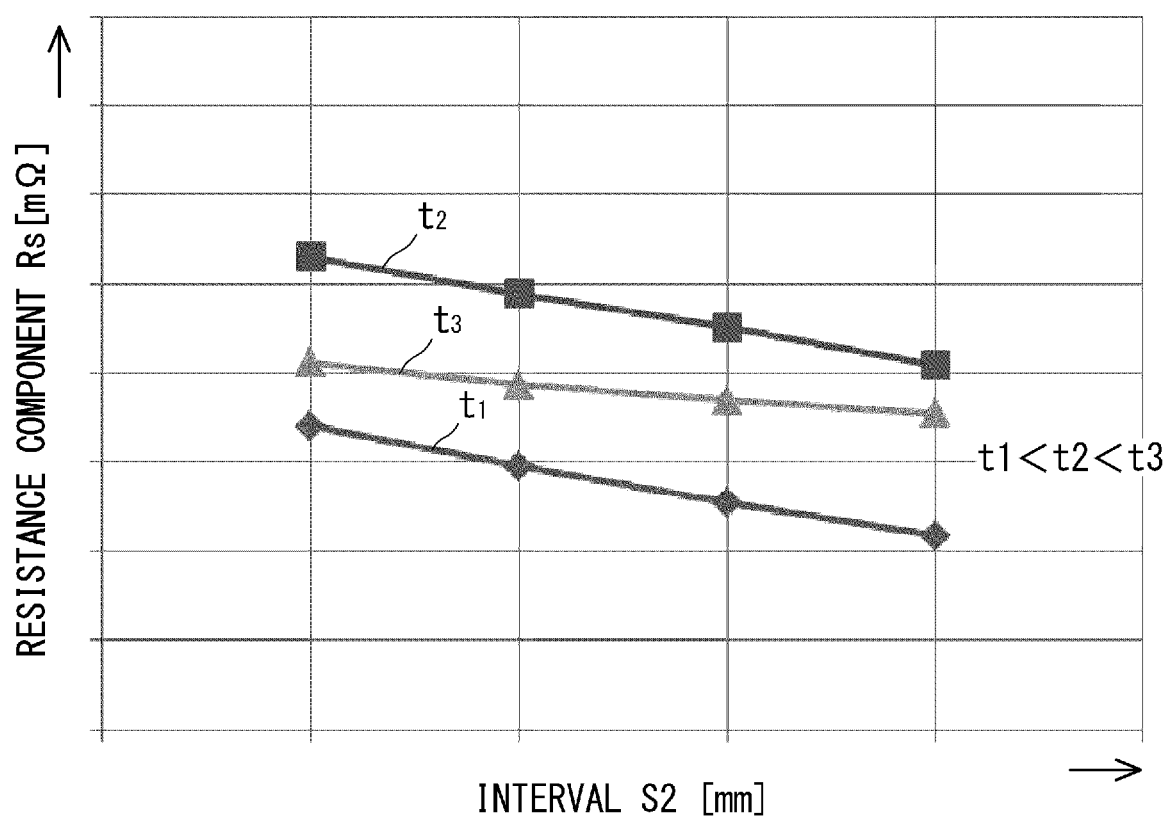
FIG. 10 is a graph showing resistance components Rs versus thicknesses T1 and T2 of covers.

Next, a plurality of other examples of the inductance device 20 were manufactured. For these other examples, resistance component characteristics Rs in the normal mode were measured and FIG. 10 shows the measurement results. In the examples whose measurement results are shown in FIG. 10, four standard levels were defined for the interval S2 between the outer end surfaces of the covers and three standard levels $t_1$, $t_2$ and $t_3$ were defined for the thicknesses T1 and T2 of the covers.

Figure 11:
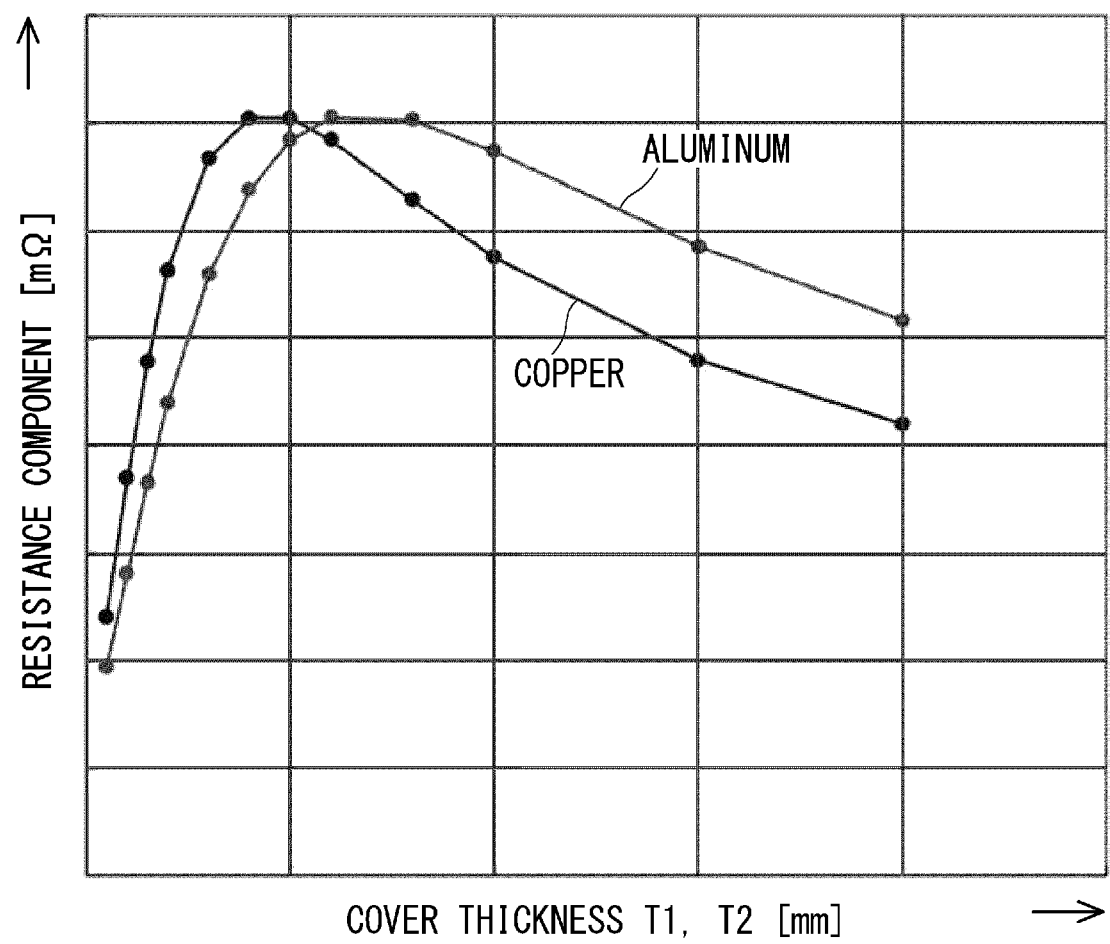
FIG. 11 is a graph showing resistance components Rs versus thicknesses.

Next, a plurality of other examples of the inductance device 20 were further manufactured. For these other examples, resistance component characteristics Rs in the normal mode were measured and FIG. 11 shows the measurement results. In the examples whose measurement results are shown in FIG. 11, two types of materials, i.e., an aluminum alloy and a copper alloy were used as the material for the covers and 12 standard levels were defined for the thicknesses T1 and T2 of the covers.

Figure 12:
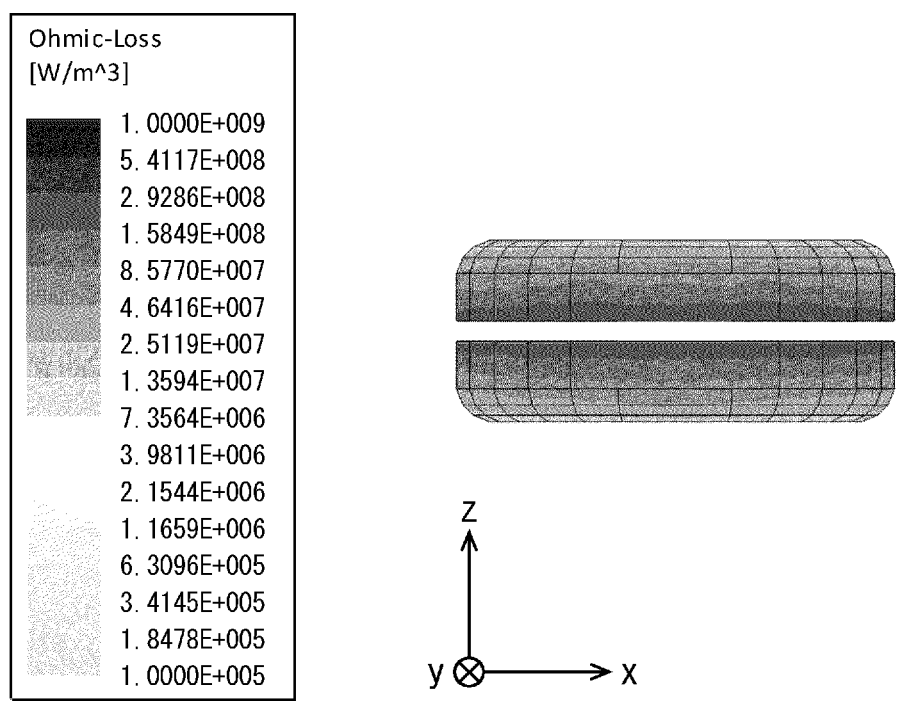
FIG. 12 shows a loss distribution in a region located between windings of an inductive element.
Figure 13:
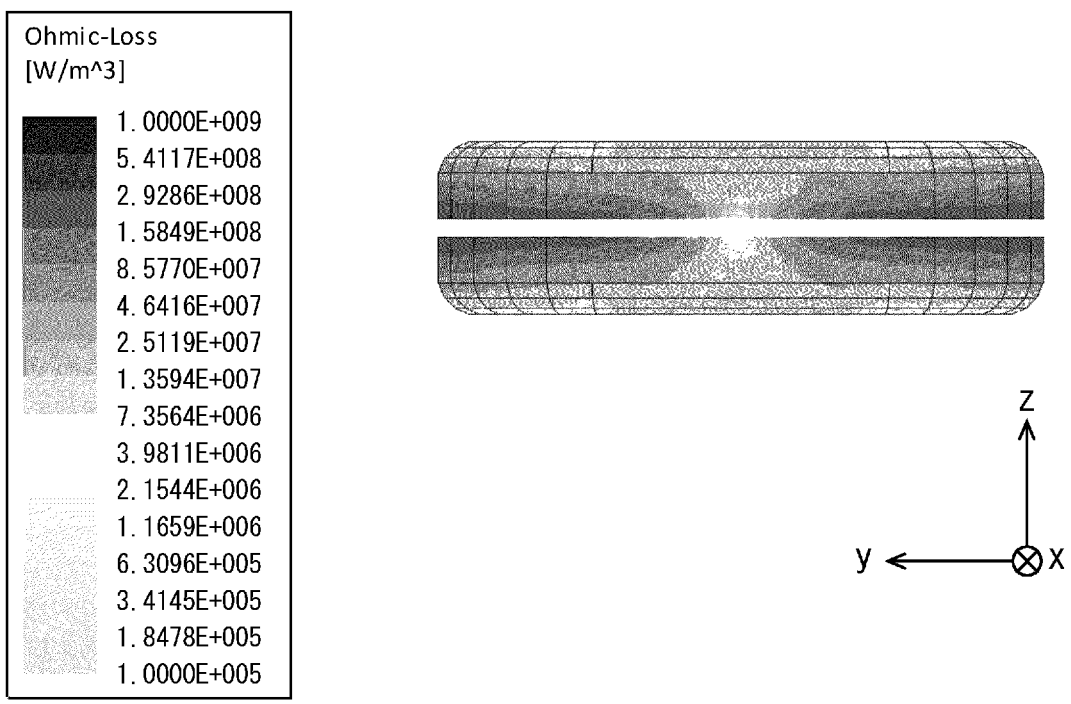
FIG. 13 shows a loss distribution in a region located between windings of an inductive element.

Lastly, loss distributions in covers were calculated by using a calculator. FIGS. 12 and 13 show the results. Specifically, FIG. 12 shows a loss distribution in regions located between the windings 4 and 5 on surfaces corresponding to the outer circumferential surfaces 2b and 3b of the covers 2 and 3. Further, FIG. 13 shows a loss distribution in regions around which the winding 4 was wound on surfaces corresponding to the outer circumferential surfaces 2b and 3b of the covers 2 and 3. Note that the covers shown in FIG. 12 are viewed from the same direction as the arrow A1 shown in FIG. 4. The covers shown in FIG. 13 are viewed from the same direction as the arrow A2 shown in FIG. 4.

(Measurement Result and Calculation Result)

As shown in FIG. 8, the impedances Z and the inductances L with respect to the frequencies were not significantly different between the example and the comparative example. Therefore, it is considered that the presence/absence of the covers does not significantly affect the common mode characteristics of the LC filter.

As shown in FIG. 9, the example has a significantly higher impedance at a predetermined frequency F1 than the comparative example. That is, the example has a higher resistance component Rs than the comparative example. One of the conceivable reasons for this difference is as follows. The LC filter according to the example has the configuration in which the core is covered by using two covers containing metal. Therefore, a leakage flux is generated in the inductive element in the normal mode. This leakage flux interacts with the two covers and thereby generates eddy currents. Since the inner end surfaces of the two covers are spaced apart from each other and the outer end surfaces of the two covers are also spaced apart from each other, the eddy currents do not cancel out each other inside the two covers. Therefore, they have excellent values. As the eddy currents increase the magnetic resistance, the resistance component Rs for the normal mode increases. As a result, the LC filter 100 has an excellent resistance component Rs and can lower the Q-value.

As shown in FIG. 10, there is a tendency that as the interval S2 between the outer end surfaces of the covers changes, the resistance component Rs decreases. Further, as the thicknesses T1 and T2 of the covers increase to three standards levels $t_1$, $t_2$ and $t_3$, the resistance component Rs changes. The resistance component Rs can be adjusted to an arbitrary value by appropriately changing the interval S2 between the outer end surfaces of the covers and the thicknesses T1 and T2 of the covers.

As shown in FIG. 11, regardless of whether the material for the covers is an aluminum alloy or a copper alloy, as the thicknesses T1 and T2 of the covers increase, the resistance component Rs first increases and then after reaching the peak, gradually decreases. Although the heights of the peaks were not significantly different from each other, there is a large difference between the thicknesses T1 and T2 of the covers at which the resistance components reached the peaks, indicating that they are different from each other. It is considered that these differences resulted from the types of the materials for the covers.

As shown in FIG. 12, a loss in a part near the outer end surface 2e of the cover 2 and the outer end surface 3e of the cover 3 between the windings 4 and 5 is larger than losses in the other parts. Therefore, it is considered that the part near the outer end surface 2e of the cover 2 and the outer end surface 3e of the cover 3 between the windings 4 and 5 generates heat in a concentrated manner.

As shown in FIG. 13, a loss in the part near the outer end surface 2e of the cover 2 and the outer end surface 3e of the cover 3 around which the winding 4 is wound is smaller than losses in the other parts. Therefore, it is considered that the region near the outer end surface 2e of the cover 2 and the outer end surface 3e of the cover 3 around which the winding 4 is wound generates heat in a concentrated manner.

The present disclosure is not limited to the above-described embodiments and may be modified as appropriate without departing from the spirit of the present disclosure.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

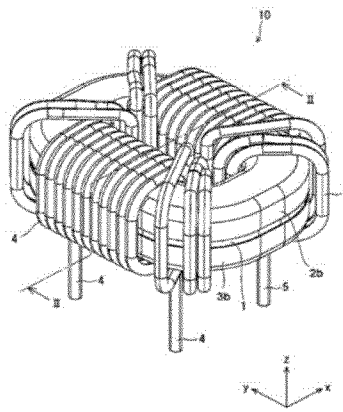

What is claimed is:

1. An inductive element comprising:
   an annular core;
   a first cover and a second cover covering the core; and
   a first winding and a second winding wound around a region of the core and the first and second covers,
   wherein
   when a direction in which an axis which is surrounded by the annular core extends is defined as an axial direction, the core includes an inner circumferential surface, an outer circumferential surface, an end surface on one end side in the axial direction, and an end surface on the other end side, the first cover covers a part of the inner circumferential surface of the core, a part of the outer circumferential surface thereof, and the end surface on the one end side of the core, and includes an inner end surface extending over the inner circumferential surface of the core and an outer end surface extending over the outer circumferential surface thereof, the second cover covers a part of the inner circumferential surface of the core, a part of the outer circumferential surface thereof, and the end surface on the other end side thereof, and includes an inner end surface extending over the inner circumferential surface of the core and an outer end surface extending over the outer circumferential surface thereof, the inner end surfaces of the first and second covers are spaced apart from each other, and the outer end surfaces of the first and second covers are spaced apart from each other, wherein the inner end surfaces of the first and second covers are spaced apart from each other by a predetermined interval over their entire areas, and the outer end surfaces of the first and second covers are spaced apart from each other by a predetermined interval over their entire areas, wherein the interval between the inner end surfaces of the first and second covers is larger than the interval between the outer end surfaces of the first and second covers.

2. The inductive element according to claim 1, wherein the first and second windings are spaced apart from each other by a predetermined interval.

\* \* \* \* \*

UNITED STATES PATENT AND TRADEMARK OFFICE
CERTIFICATE OF CORRECTION

PATENT NO. : 11,056,262 B2
APPLICATION NO. : 16/013207
DATED : July 6, 2021
INVENTOR(S) : Michitaka Itaya et al.

It is certified that error appears in the above-identified patent and that said Letters Patent is hereby corrected as shown below:

On the Title Page

Replace Title Page with Attached Title Page.

In the Claims

Column 10, after Line 17, insert the following claims:

-- 3. The inductive element according to Claim 1, further comprising a case, wherein the case includes an opening from which a part of the first and second covers may be exposed.

4. The inductive element according to Claim 1, further comprising a heat sink, wherein the heat sink is disposed between the first and second windings. --.

Signed and Sealed this
Fourteenth Day of June, 2022

Katherine Kelly Vidal
*Director of the United States Patent and Trademark Office*

(12) United States Patent
Itaya et al.

(10) Patent No.: US 11,056,262 B2
(45) Date of Patent: Jul. 6, 2021

(54) INDUCTIVE ELEMENT AND LC FILTER

(71) Applicants: KABUSHIKI KAISHA TOYOTA JIDOSHOKKI, Aichi-ken (JP); TOKIN Corporation, Miyagi (JP)

(72) Inventors: Michitaka Itaya, Miyagi (JP); Toshiaki Oka, Miyagi (JP); Koki Harada, Miyagi (JP); Yukiyasu Yamauchi, Miyagi (JP); Takuma Terui, Miyagi (JP); Takeshi Harasawa, Aichi-ken (JP); Atsushi Naito, Aichi-ken (JP); Keiji Yashiro, Aichi-ken (JP); Kazuhiro Shiraishi, Aichi-ken (JP)

(73) Assignees: KABUSHIKI KAISHA TOYOTA JIDOSHOKKI, Aichi-ken (JP); TOKIN Corporation, Miyagi (JP)

( * ) Notice: Subject to any disclaimer, the term of this patent is extended or adjusted under 35 U.S.C. 154(b) by 341 days.

(21) Appl. No.: 16/013,207

(22) Filed: Jun. 20, 2018

(65) Prior Publication Data
US 2019/0006079 A1    Jan. 3, 2019

(30) Foreign Application Priority Data
Jun. 30, 2017   (JP) .................. JP2017-128372

(51) Int. Cl.
*H01F 17/06*   (2006.01)
*H05K 1/02*   (2006.01)
(Continued)

(52) U.S. Cl.
CPC ............ *H01F 17/06* (2013.01); *H01F 5/04* (2013.01); *H01F 17/062* (2013.01); *H01F 27/02* (2013.01);
(Continued)

(58) Field of Classification Search
CPC .................... H01F 17/06; H01F 17/062
See application file for complete search history.

(56) References Cited

U.S. PATENT DOCUMENTS 3,680,018 A * 7/1972 Elberger ............. H01F 17/04
                                                        336/221
4,646,803 A * 3/1987 Hanaoka ............ H01F 27/306
                                                        206/303
(Continued)

FOREIGN PATENT DOCUMENTS

JP    2000-068134 A    3/2000
JP    2008098307          4/2008
(Continued)

OTHER PUBLICATIONS

Office Action dated Jul. 22, 2019 in the corresponding KR Patent Application No. 2018-0075730.

*Primary Examiner* — Elvin G Enad
*Assistant Examiner* — Malcolm Barnes
(74) *Attorney, Agent, or Firm* — Renner, Otto, Boisselle & Sklar LLP

(57) ABSTRACT

The present disclosure provides an inductive element capable of lowering a Q-value. An inductive element includes a first cover and a second cover covering an annular core, and a first winding and a second winding wound around a region of the core, the first cover and the second cover. The first cover covers a part of an inner circumferential surface of the core, a part of an outer circumferential surface and an end surface on one end side in an axial direction. The second cover covers a part of the inner circumferential surface of the core, a part of the outer circumferential surface an end surface on the other end side in the axial direction.

4 Claims, 13 Drawing Sheets